United States Patent
Lin

(10) Patent No.: US 6,999,322 B1
(45) Date of Patent: Feb. 14, 2006

(54) MEMORY STICK HAVING A USB PORT

(75) Inventor: Chih-Chien Lin, Taipei Hsien (TW)

(73) Assignee: Chant Sincere Co., Ltd., Taipei Hsien (TW)

( * ) Notice: Subject to any disclaimer, the term of this patent is extended or adjusted under 35 U.S.C. 154(b) by 20 days.

(21) Appl. No.: 10/901,223

(22) Filed: Jul. 29, 2004

(51) Int. Cl.
*H05K 7/02* (2006.01)

(52) U.S. Cl. ............... 361/752; 361/733; 439/76.1

(58) Field of Classification Search ............... 361/728, 361/736, 737, 752; 439/131, 134, 76.1, 141
See application file for complete search history.

(56) References Cited

U.S. PATENT DOCUMENTS

| | | | |
|---|---|---|---|
| 6,456,500 B1 * | 9/2002 | Chen | 361/752 |
| 6,676,419 B1 * | 1/2004 | Lin et al. | 439/76.1 |
| 6,744,634 B1 * | 6/2004 | Yen | 361/752 |
| 6,804,749 B1 * | 10/2004 | Chien et al. | 711/115 |
| 6,813,164 B1 * | 11/2004 | Yen | 361/785 |
| 2004/0145875 A1 * | 7/2004 | Yu et al. | 361/752 |
| 2004/0233645 A1 * | 11/2004 | Chen | 361/737 |
| 2004/0233646 A1 * | 11/2004 | Yen | 361/752 |

* cited by examiner

*Primary Examiner*—Kamand Cuneo
*Assistant Examiner*—Dameon E. Levi
(74) *Attorney, Agent, or Firm*—Bacon & Thomas, PLLC

(57) ABSTRACT

A memory stick includes a plastic shell, an elongated metal casing mounted in the plastic shell and having a front extension exposed to the outside of the plastic shell for insertion into a USB socket of a computer, a circuit board mounted inside the elongated metal casing and having a USB connector suspended in the front extension of the elongated metal casing, a locating frame mounted inside the metal casing to support the circuit board, and an end cap capped on the rear end of the circuit board and inserted with the circuit board into the rear end of the hollow plastic shell.

7 Claims, 11 Drawing Sheets

MEMORY STICK HAVING A USB PORT

BACKGROUND OF THE INVENTION (a) Field of the Invention

The present invention relates a memory stick and more particularly, to a memory stick having a USB port that is comprised of a metal casing, a plastic shell, a circuit board, a locating frame, and an end cap.

(b) Description of the Prior Art

A conventional memory stick having a USB (Universal Serial Bus) port essentially comprises a bottom cover shell, a top cover shell covering the bottom cover shell, a circuit board mounted in between the bottom cover shell and the top cover shell, and a plastic covering molded on the top and bottom cover shells. The procedure to connect the top cover shell to the bottom cover shell is complicated. Further, when molding the plastic covering on the top and bottom cover shell, the high temperature of the molding plastics may cause the USB connector of the circuit board to deform. Because the memory stick has no means to support the USB connector firmly inside the cover shells, the USB connector may be damaged easily during installation.

SUMMARY OF THE INVENTION

The present invention has been accomplished under the circumstances in view. According to one aspect of the present invention, the memory stick comprises a hollow plastic shell; an elongated metal casing mounted in the hollow plastic shell, the elongated metal casing having a front end, a rear end, two shoulders symmetrically disposed at two opposite lateral sides thereof, and a front extension forwardly extended from the front end between the shoulders and exposed to the outside of the hollow plastic shell for insertion into a USB socket of an electronic device; a circuit board mounted inside the elongated metal casing, the circuit board having a USB connector forwardly extended from a front end thereof and suspended in the front extension of the elongated metal casing; and a locating frame mounted inside the elongated metal casing and capped on the connection area between the circuit board and the USB connector, the locating frame having two front end edges respectively stopped against the shoulders of the elongated metal casing. According to another aspect of the present invention, the memory stick further comprises an end cap capped on a rear end of the circuit board and inserted with the circuit board into the rear end of the hollow plastic shell. According to still another aspect of the present invention, the end cap is comprised of a first end cap member capped on the rear end of the metal casing, and a second end cap member inserted into the first end cap member. According to an alternate form of the present invention, the end cap comprises two retaining spring plates inserted into the rear end of the metal casing. The retaining spring plates each have a plurality of hooked portions respectively forced into engagement with respective retaining holes in the metal casing and respective retaining holes in the plastic shell.

DETAILED DESCRIPTION OF THE PREFERRED EMBODIMENTS

Figure 1:
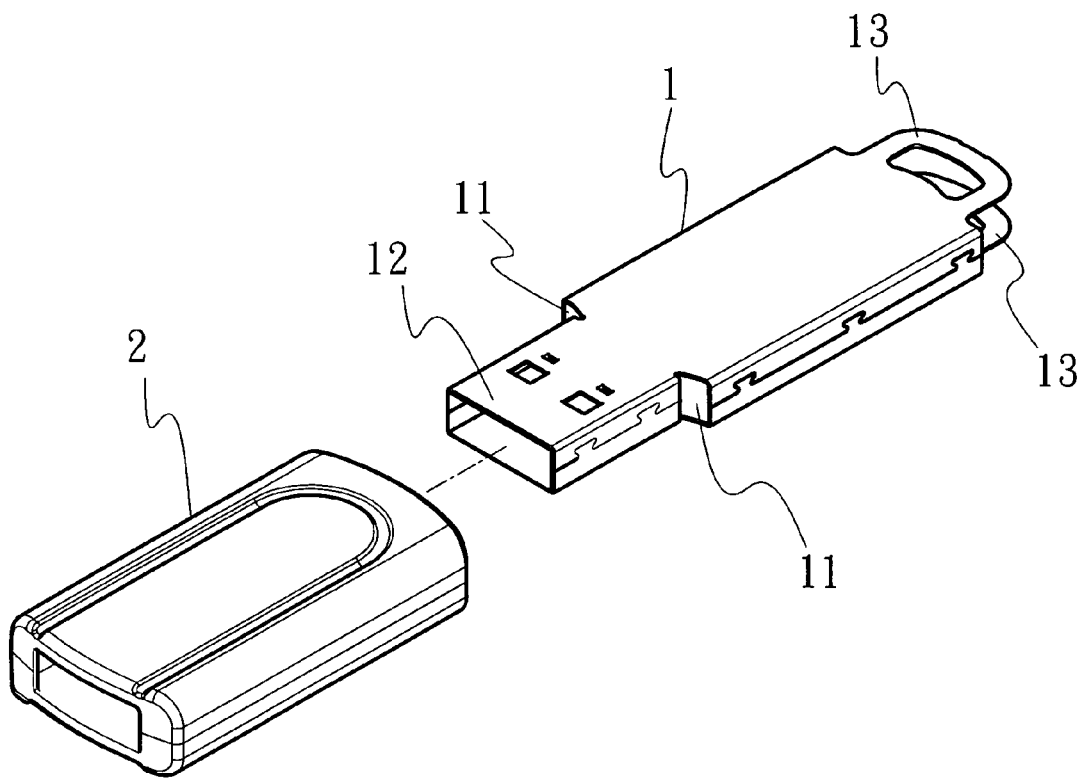
FIG. 1 is an exploded view of a metal casing and a plastic shell for a memory stick according to the first embodiment of the present invention.

Referring to FIGS. 1~6, a memory stick in accordance with a first embodiment of the present invention is shown comprised of a metal casing 1, a hollow plastic shell 2, a circuit board 3, a locating frame 4, and an end cap 5.

The metal casing 1, as shown in FIG. 1, is adapted to accommodate the circuit board 3, having two shoulders 11 symmetrically disposed at two opposite lateral sides thereof, a front extension 12 forwardly extended from the front end between the shoulders 11 for insertion into a USB socket of a computer, and two eyelet lugs 13 backwardly extended from the rear end and arranged in parallel.

Figure 2:
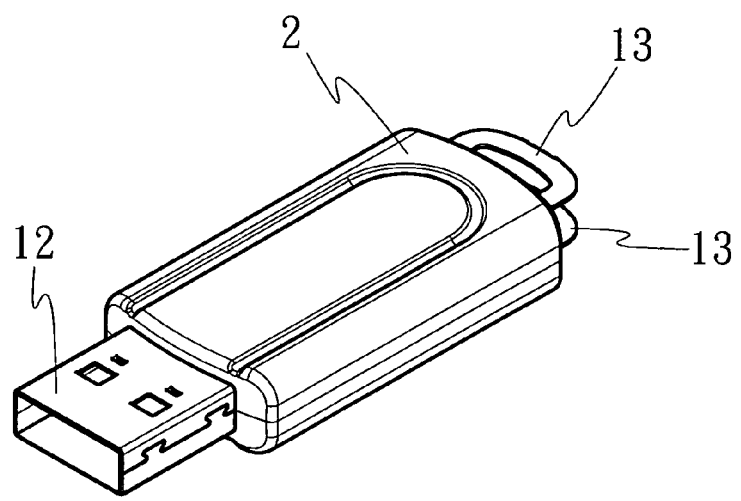
FIG. 2 is an elevational assembly view of FIG. 1.

The hollow plastic shell 2 is molded from plastics and capped onto the metal casing 1, keeping the front extension 12 and the eyelet lugs 13 exposed to the outside (see FIG. 2).

Figure 3:
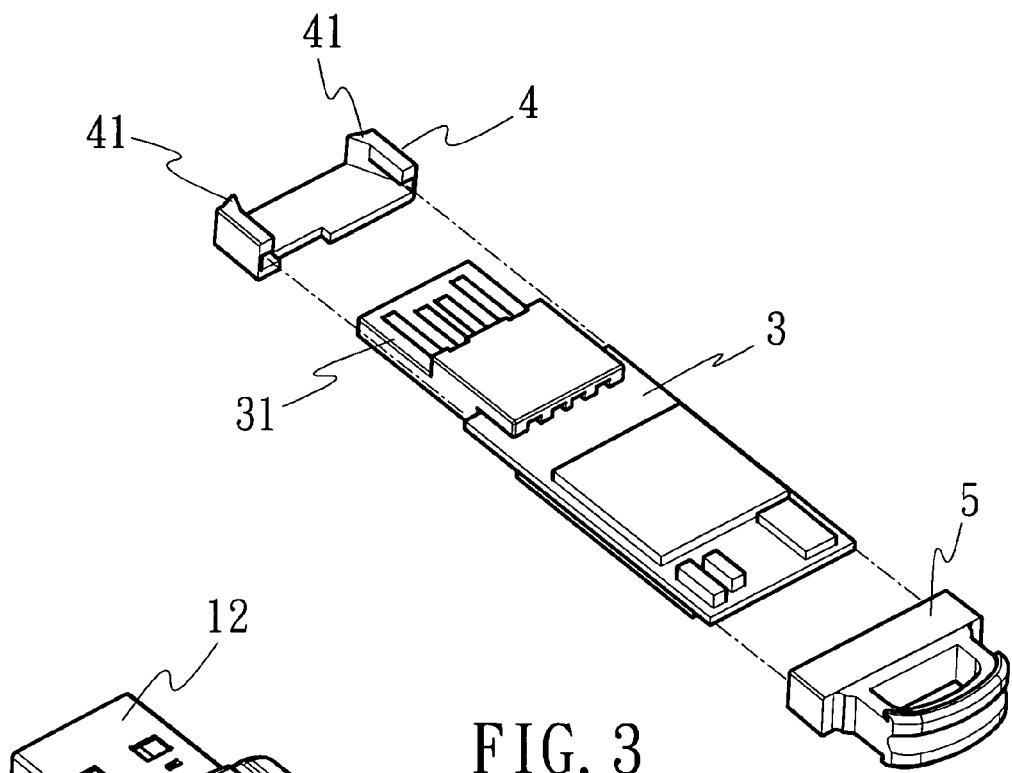
FIG. 3 is an exploded view of a locating frame, a circuit board, and an end cap for a memory stick according to the first embodiment of the present invention.
Figure 4:
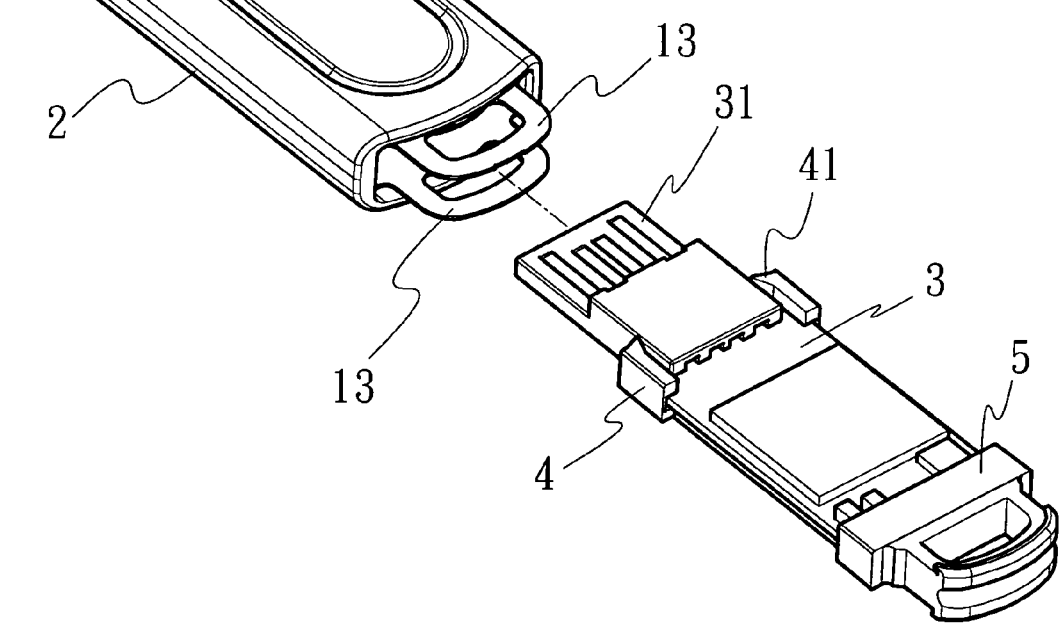
FIG. 4 is an exploded view of a memory stick according to the first embodiment of the present invention.
Figure 5:
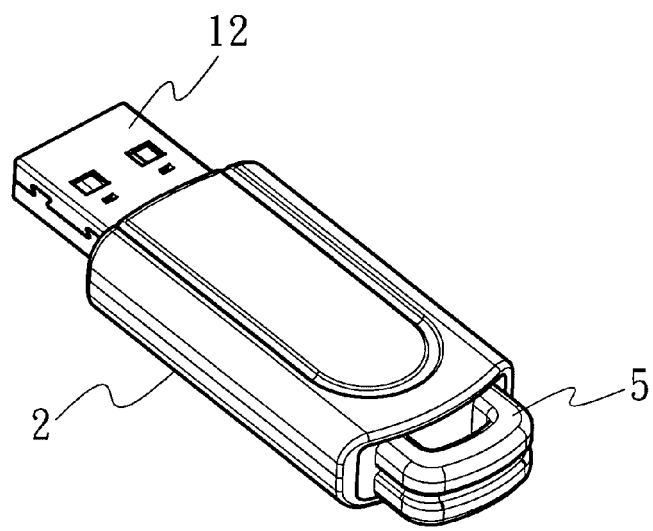
FIG. 5 is an elevational assembly view of the memory stick according to the first embodiment of the present invention.
Figure 6:
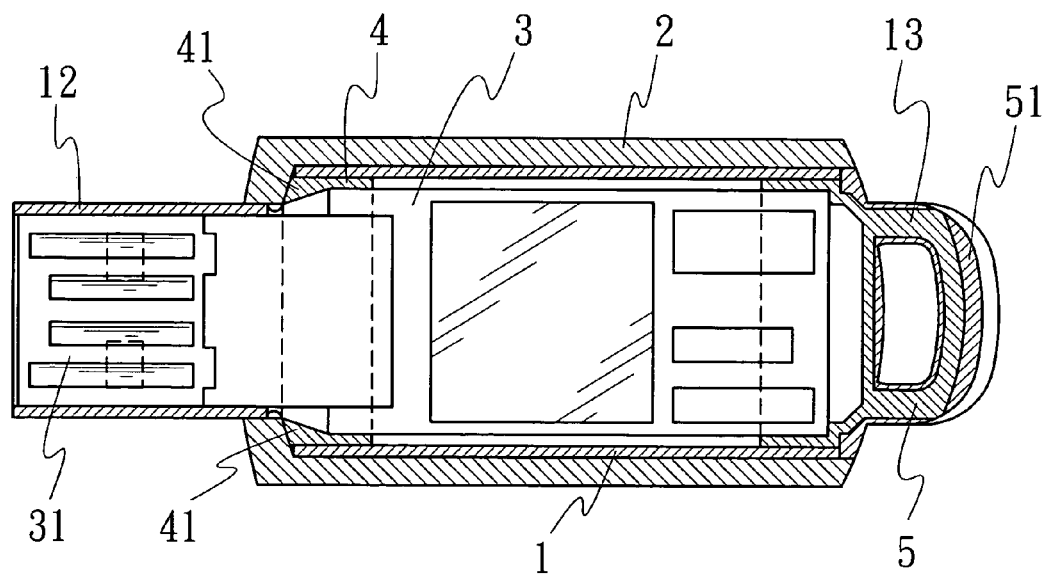
FIG. 6 is a sectional view of the memory stick according to the first embodiment of the present invention.
Figure 7:
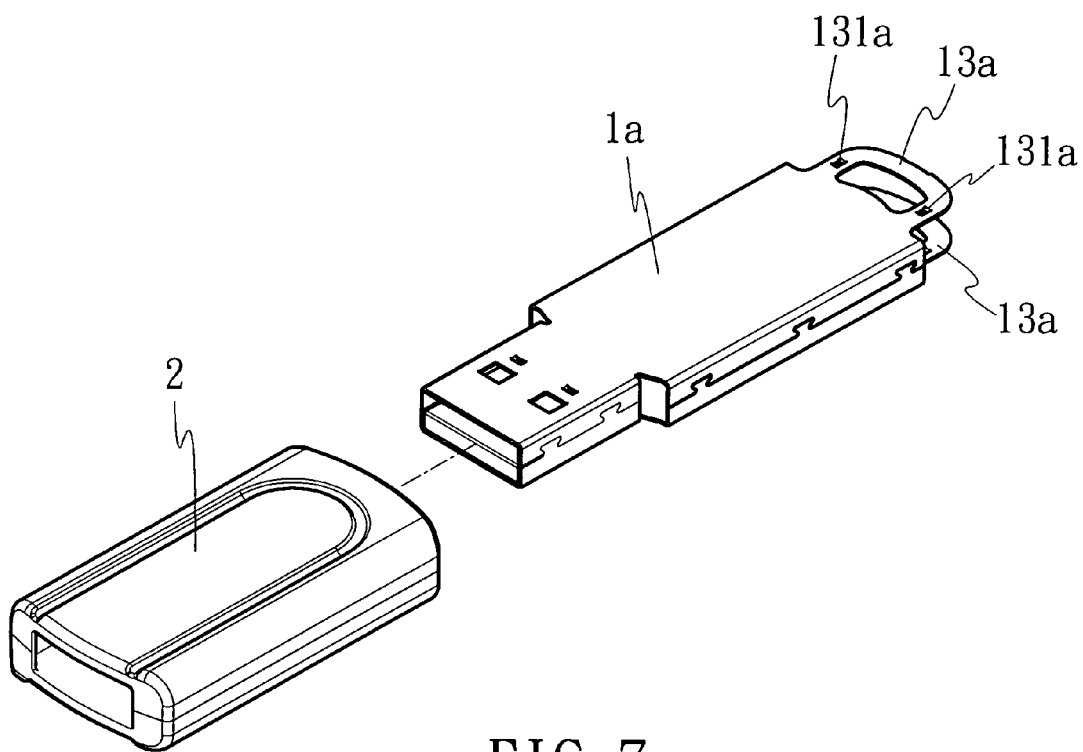
FIG. 7 is an exploded view of a metal casing and a plastic shell for a memory stick according to the second embodiment of the present invention.
Figure 8:
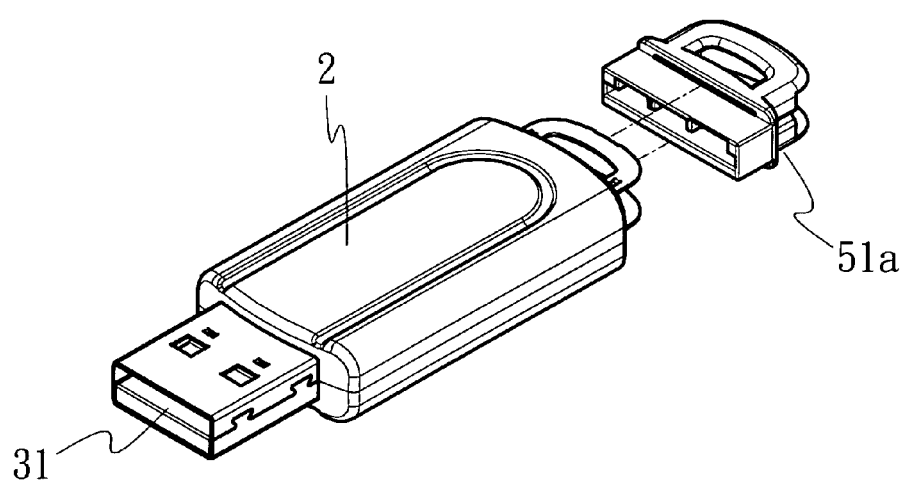
FIG. 8 is an exploded view of a part of the memory stick according to the second embodiment of the present invention.
Figure 9:
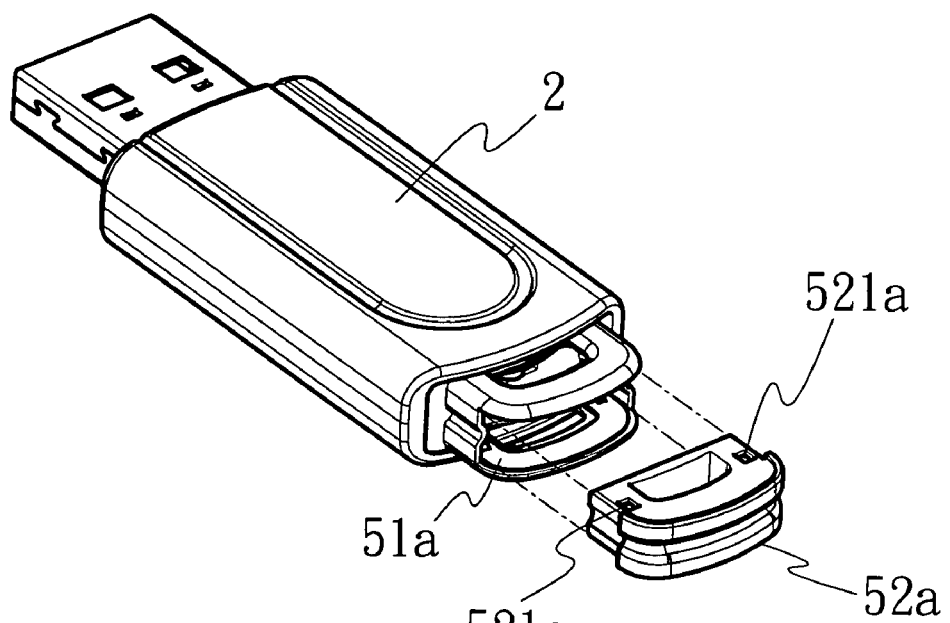
FIG. 9 is an exploded view of a part of the memory stick according to the second embodiment of the present invention.
Figure 10:
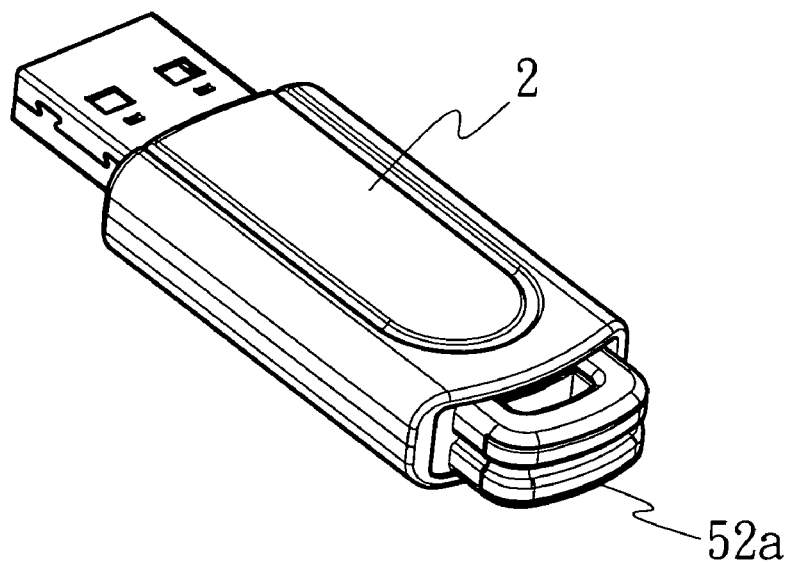
FIG. 10 is an elevational assembly view of the memory stick according to the second embodiment of the present invention.
Figure 11:
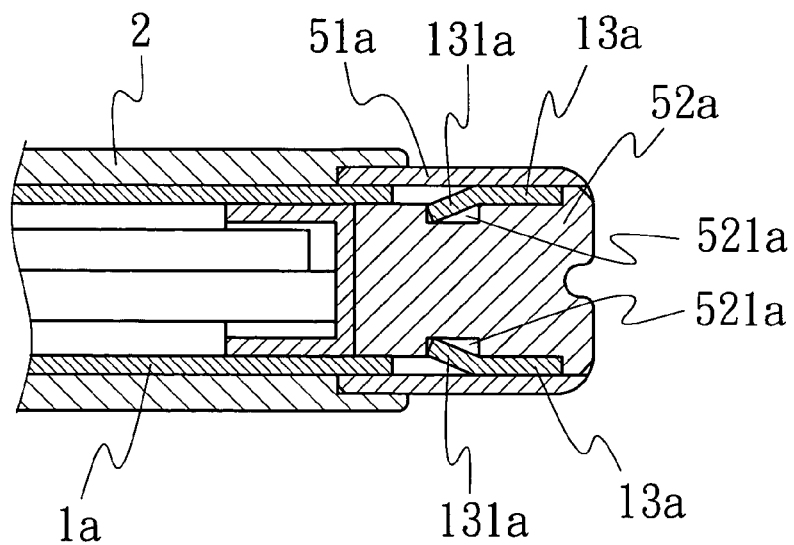
FIG. 11 is a sectional view of a part of the memory stick according to the second embodiment of the present invention.
Figure 12:
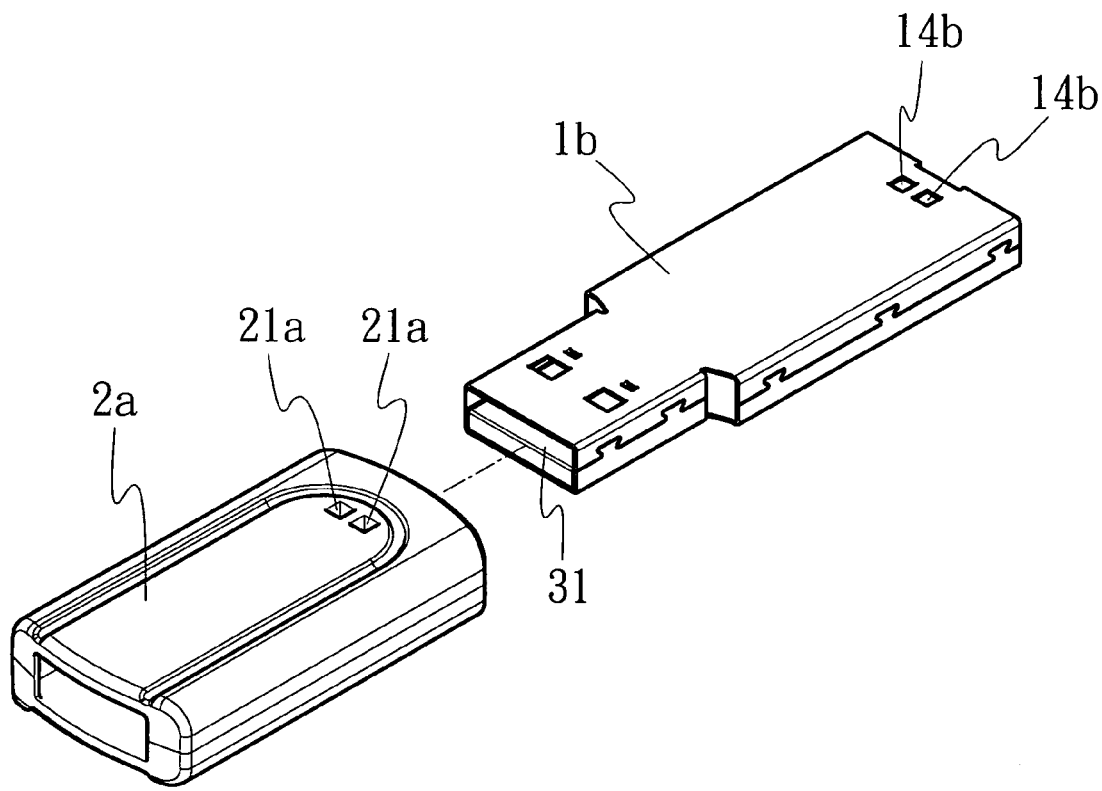
FIG. 12 is an exploded view of a metal casing and a plastic shell for a memory stick according to the third embodiment of the present invention.
Figure 13:
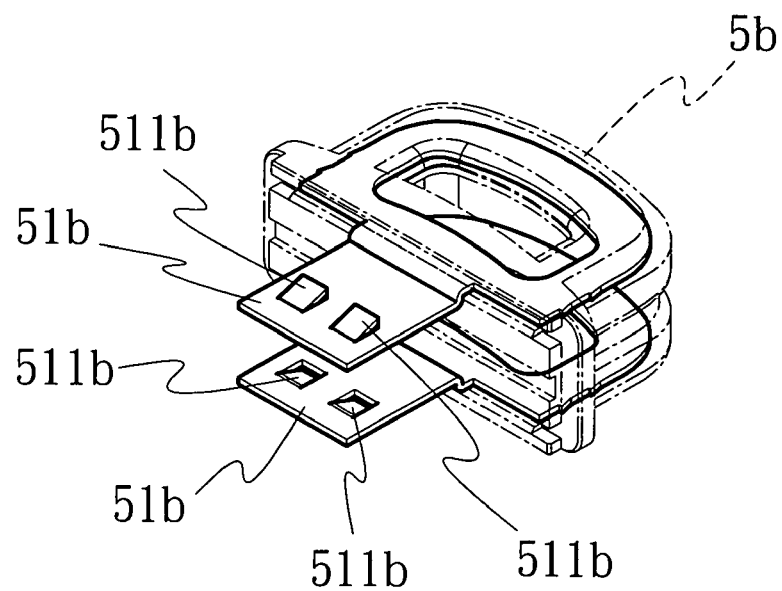
FIG. 13 is a perspective view of the end cap for the memory stick according to the third embodiment of the present invention.
Figure 14:
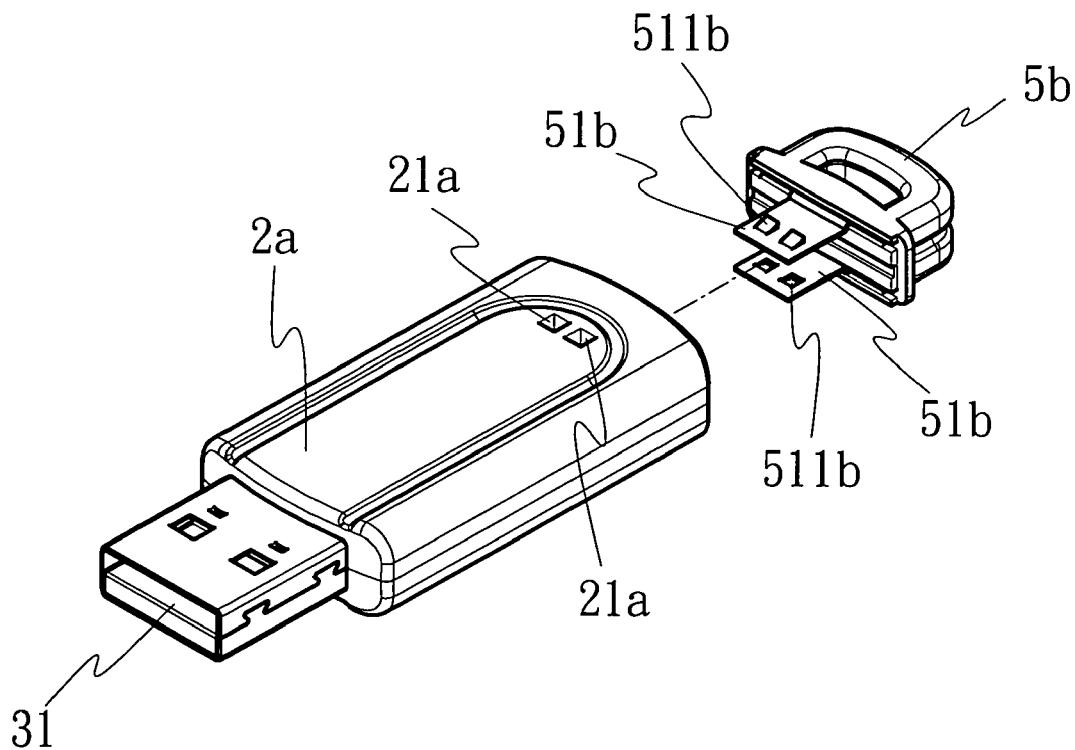
FIG. 14 is an exploded view of the memory stick according to the third embodiment of the present invention.
Figure 15:
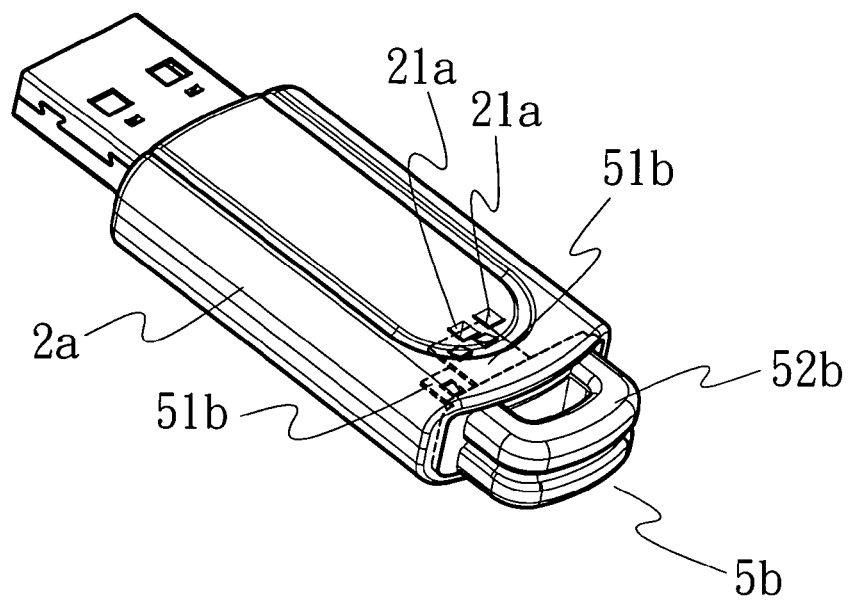
FIG. 15 is an elevational assembly view of the memory stick according to the third embodiment of the present invention.
Figure 16:
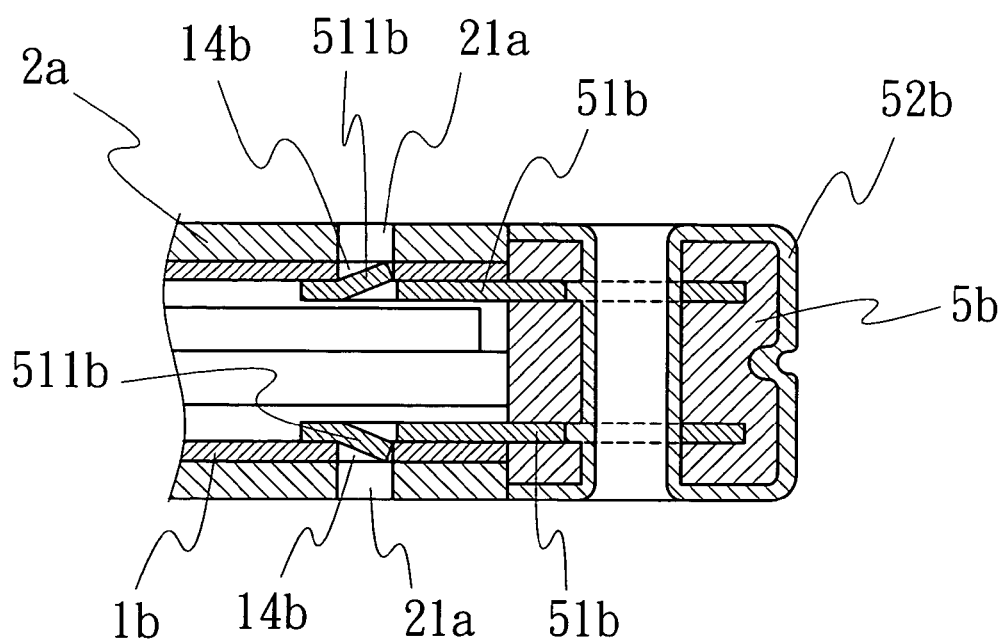
FIG. 16 is a sectional view of a part of the memory stick according to the third embodiment of the present invention.
Figure 17:
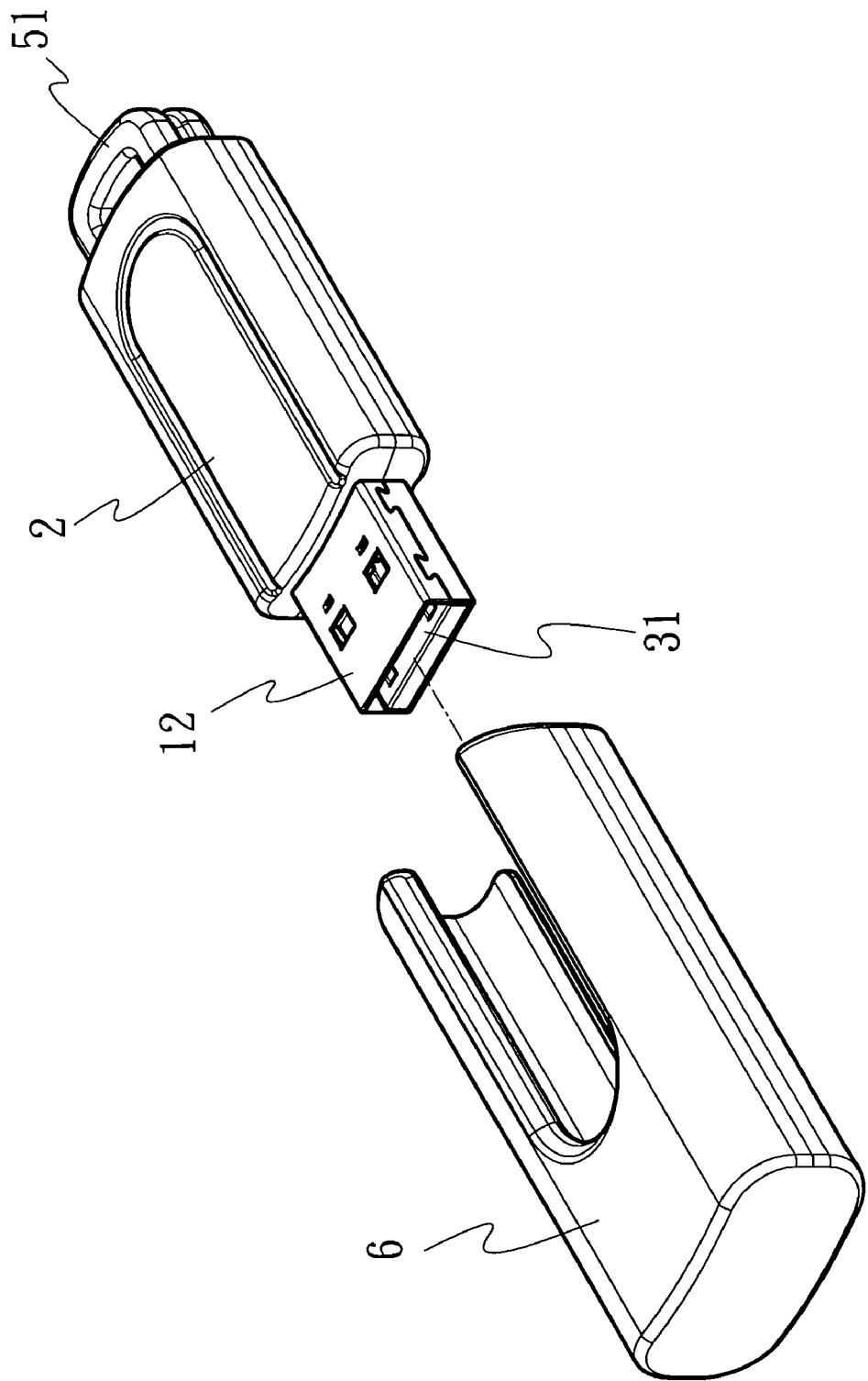
FIG. 17 is an exploded view showing the memory stick used with a case according to the present invention.
Figure 18:
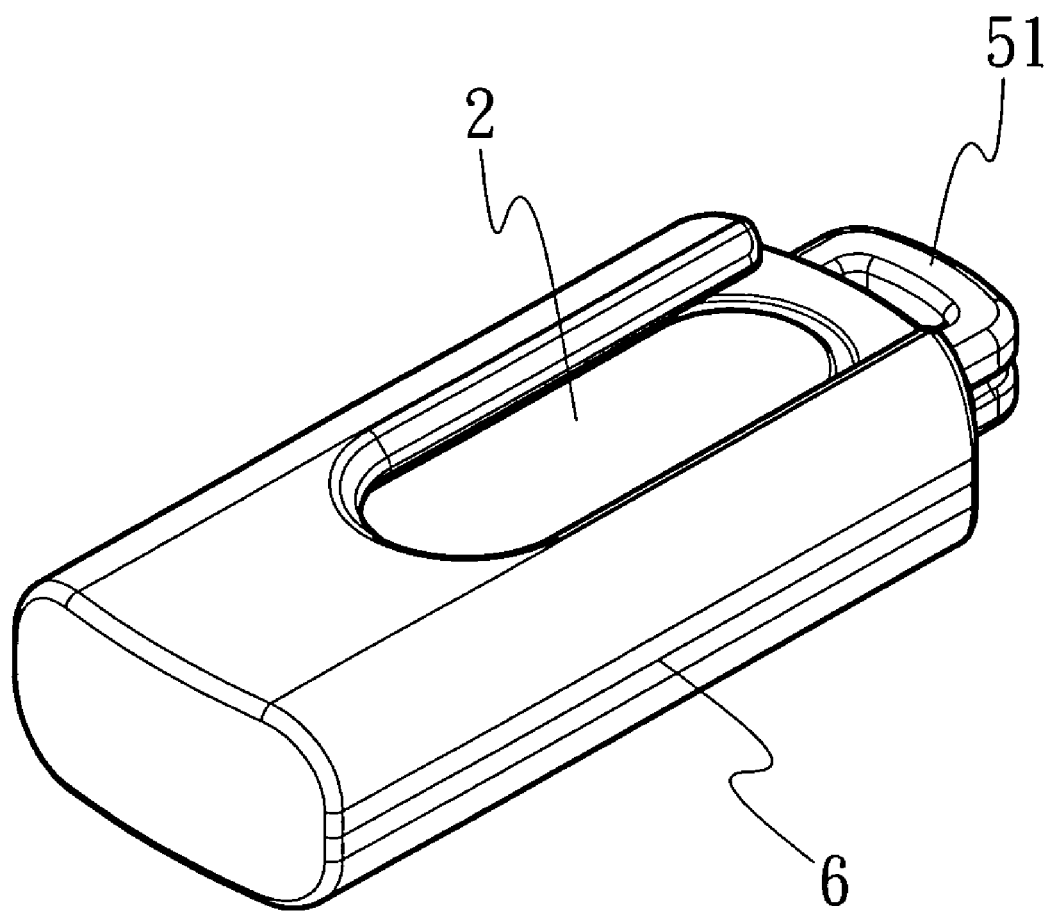
FIG. 18 is an assembly view of FIG. 17.
Figure 19:
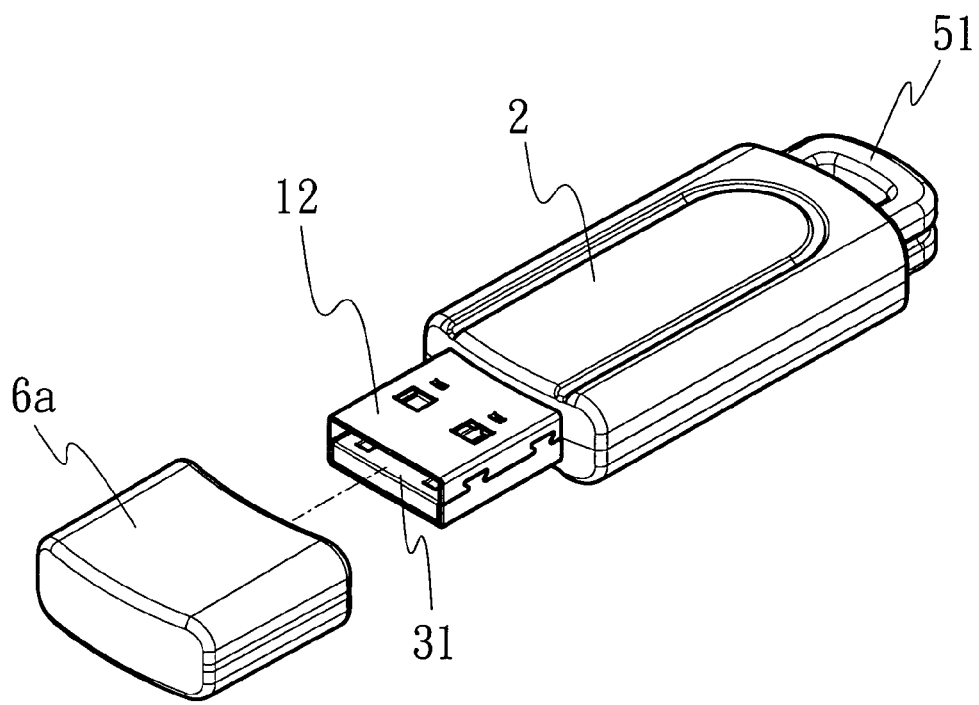
FIG. 19 is an exploded view showing the memory stick used with a cap according to the present invention.
Figure 20:
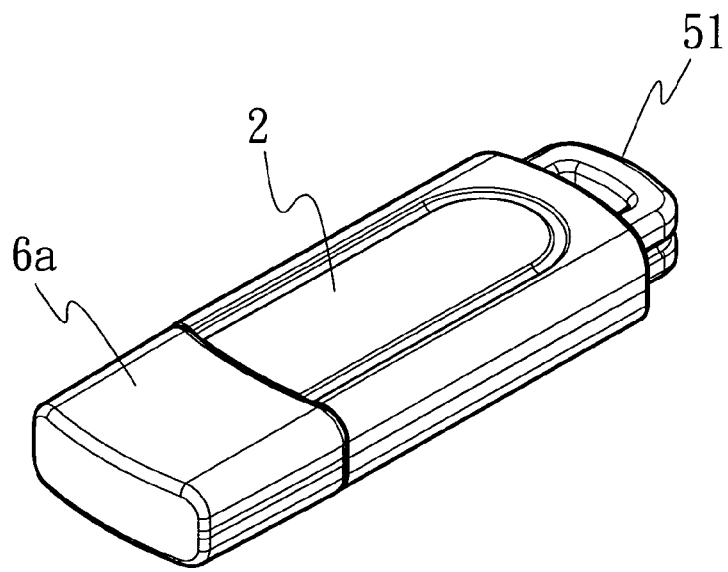
FIG. 20 is an assembly view of FIG. 19.

The circuit board 3, as shown in FIG. 3, is an electronic circuit assembly constructed according to known techniques to provide a specific function or a combination of functions, having a USB connector 31 forwardly extended from the front side thereof. As illustrated in FIGS. 4~6, the circuit board 3 is inserted into the metal casing 1 inside the hollow plastic shell 2, keeping the USB connector 31 suspended in the front extension 12.

The locating frame 4 is mounted inside the metal casing 1 and capped on the connection area between the circuit board 3 and the USB connector 31, having two front end edges 41 respectively stopped against the shoulders 11 of the metal casing 1 (see FIG. 6).

The end cap 5 is capped on the rear end of the circuit board 3 and inserted with the circuit board 3 into one end of the hollow plastic shell 2 to close the rear end of the hollow plastic shell 2. After insertion of the end cap 5 into one end of the hollow plastic shell 2, a plastic covering 51 is molded on the end cap 5 and the eyelet lugs 13 (see FIG. 6).

According to the aforesaid first embodiment, the component parts of the memory stick can easily and quickly be assembled. Further, this embodiment uses the metal casing 1 as the main body of the memory stick, the structural strength of the memory stick is well reinforced.

FIGS. 7~11 show a memory stick having a USB port according to a second embodiment of the present invention. According to this embodiment, the eyelet lugs 13a of the metal casing, referenced by 1a, are stamped to have a plurality of inwardly projected hook portions 131a; a hollow first end cap element 51a is capped on the eyelet lugs 13a of the metal casing 1a and inserted into one end of the plastic shell 2; a solid second end cap element 52a is inserted into the first end cap element 51a and the inside of the metal casing 1a between the eyelet lugs 13a. The second end cap element 52a has a plurality of retaining holes 521a respectively forced into engagement with the inwardly projected hooked portions 131a of the eyelet lugs 13a of the metal casing, referenced by 1a.

FIGS. 12~16 show a memory stick having a USB port according to a third embodiment of the present invention. According to this embodiment, the memory stick is comprised of a metal casing 1b, a hollow plastic shell 2a, a circuit board 3 (not shown), a locating frame 4 (not shown), and an end cap 5b. The circuit board 3 and the locating frame 4 are similar to the like members of the aforesaid first embodiment. The metal casing 1b has a plurality of retaining holes 14b symmetrically cut through the top and bottom walls near the rear end. The plastic shell 2a has a plurality of retaining holes 21a symmetrically cut through the top and bottom walls corresponding to the retaining holes 14b of the metal casing 1b. The end cap 5b comprises two retaining spring plates 51b backwardly suspended at different elevations. The retaining spring plates 51b each have a plurality of outwardly projected retaining blocks 511b for engaging the retaining holes 14b of the metal casing 1b and the retaining holes 21a of the plastic shell 2a. After mounting of the circuit board 3 and the locating frame 4 in the metal casing 1b and the metal casing 1b in the plastic shell 2a, the retaining spring plates 51b of the end cap 5b are inserted into the rear end of the metal casing 1b to engage the retaining blocks 511b into the retaining holes 14b of the metal casing 1b and the retaining holes 21a of the plastic shell 2a. At final, a plastic covering 52b is molded on the end cap 5b and a part of the metal casing 1b in flush with the plastic shell 2a.

The aforesaid circuit board 3 is a functional electronic circuit member that can be a single-function circuit means for data access, or a multi-function circuit means having wireless network receiver means.

Referring to FIGS. 17~20, a case 6 or cap 6a may be used to receive the memory stick or to cover the front extension 12, giving a protection to the USB connector 31.

A prototype of memory stick having a USB port has been constructed with the features of the annexed drawings of FIGS. 1~6. The memory stick having a USB port functions smoothly to provide all of the features discussed earlier.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A memory stick comprising:

a hollow plastic shell;

an elongated metal casing mounted in said hollow plastic shell, said elongated metal casing having a front end, a rear end, two shoulders symmetrically disposed at two opposite lateral sides thereof, and a front extension forwardly extended from the front end between said shoulders and exposed to the outside of said hollow plastic shell for insertion into a USB socket of an electronic device;

a circuit board mounted inside said elongated metal casing, said circuit board having a USB connector forwardly extended from a front end thereof and suspended in said front extension of said elongated metal casing;

a locating frame mounted inside said elongated metal casing and capped on the connection area between said circuit board and said USB connector, said locating frame having two front end edges respectively stopped against said shoulders of said elongated metal casing; and an end cap capped on a rear end of said circuit board and inserted with said circuit board into the rear end of said hollow plastic shell.

2. The memory stick as claimed in claim 1, wherein said elongated metal casing has two eyelet lugs backwardly extended from the rear end thereof and arranged in parallel.

3. The memory stick as claimed in claim 1, further comprising a plastic covering molded on said end cap.

4. The memory stick as claimed in claim 1, wherein said elongated metal casing has two eyelet lugs backwardly extended from the rear end thereof and arranged in parallel, said eyelet lugs each having a plurality of retaining holes; said end cap is comprised of a first end cap element and a second end cap element.

5. The memory stick as claimed in claim 4, wherein said first end cap element is capped on said eyelet lugs; said second end cap element is inserted in between said eyelet lugs within said first end cap element, having a plurality of retaining holes respectively forced into engagement with said inwardly projected hooked portions of said eyelet lugs.

6. The memory stick as claimed in claim 1 wherein said elongated metal casing has a plurality of retaining holes symmetrically formed in top and bottom walls thereof near the rear end; said plastic shell has a plurality of retaining holes corresponding to the retaining holes of said elongated metal casing; said end cap comprises two backwardly extended retaining spring plates inserted into the rear end of said elongated metal casing, said retaining spring plates each having a plurality of outwardly projected retaining blocks respectively engaged into the retaining holes of said elongated metal casing and the retaining holes of said plastic shell.

7. The memory stick as claimed in claim 6, further comprising a plastic covering molded on said end cap.

* * * * *